(12) United States Patent
Fan et al.

(10) Patent No.: US 9,583,442 B2
(45) Date of Patent: Feb. 28, 2017

(54) INTERCONNECT STRUCTURE INCLUDING MIDDLE OF LINE (MOL) METAL LAYER LOCAL INTERCONNECT ON ETCH STOP LAYER

(71) Applicants: International Business Machines Corporation, Armonk, NY (US); GlobalFoundries, Inc., Grand Cayman (KY)

(72) Inventors: Su Chen Fan, Cohoes, NY (US); Sukwon Hong, Watervliet, NY (US); William J. Taylor, Jr., Clifton Park, NY (US)

(73) Assignees: INTERNATIONAL BUSINESS MACHINES CORPORATION, Armonk, NY (US); GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/753,407

(22) Filed: Jun. 29, 2015

(65) Prior Publication Data
US 2016/0379932 A1    Dec. 29, 2016

(51) Int. Cl.
*H01L 21/4763* (2006.01)
*H01L 23/535* (2006.01)
(Continued)

(52) U.S. Cl.
CPC ........ *H01L 23/535* (2013.01); *H01L 21/7684* (2013.01); *H01L 21/76802* (2013.01);
(Continued)

(58) Field of Classification Search
CPC ........ H01L 21/76829; H01L 21/76843; H01L 21/76895; H01L 21/7684; H01L 21/76802;
(Continued)

(56) References Cited

U.S. PATENT DOCUMENTS

| 6,027,997 A | 2/2000 | Yu et al. |
| 6,127,262 A | 10/2000 | Huang et al. |

(Continued)

OTHER PUBLICATIONS

Chen et al., "56 nm pitch copper dual-damascene interconnects with triple pitch split metal and double pitch split via," IEEE International Interconnect Technology Conference (IITC), 2012, 3 pages.

*Primary Examiner* — (Vikki) Hoa B Trinh
(74) *Attorney, Agent, or Firm* — Cantor Colburn LLP; Vazken Alexanian

(57) ABSTRACT

An interconnect structure includes an insulator stack on an upper surface of a semiconductor substrate. The insulator stack includes a first insulator layer having at least one semiconductor device embedded therein and an etch stop layer interposed between the first insulator layer and a second insulator layer. At least one electrically conductive local contact extends through each of the second insulator layer, etch stop layer and, first insulator layer to contact the at least one semiconductor device. The interconnect structure further includes at least one first layer contact element disposed on the etch stop layer and against the at least one conductive local contact.

10 Claims, 5 Drawing Sheets

(51) Int. Cl.
  *H01L 21/768*    (2006.01)
  *H01L 23/532*    (2006.01)
(52) U.S. Cl.
  CPC .. *H01L 21/76829* (2013.01); *H01L 21/76843* (2013.01); *H01L 21/76895* (2013.01); *H01L 23/53238* (2013.01); *H01L 23/53295* (2013.01)
(58) Field of Classification Search
  CPC ............ H01L 23/535; H01L 23/53295; H01L 23/53238
  USPC ....... 438/624, 613, 638, 628, 637, 640, 667, 438/700, 701
  See application file for complete search history.

(56) References Cited

U.S. PATENT DOCUMENTS

| | | |
|---|---|---|
| 7,217,655 B2 | 5/2007 | Cabral, Jr. et al. |
| 7,279,419 B2 | 10/2007 | Kim et al. |
| 7,659,171 B2 | 2/2010 | Furukawa et al. |
| 7,968,965 B2* | 6/2011 | Kim .................... H01L 27/0688 257/508 |
| 8,124,525 B1 | 2/2012 | Koburger, III et al. |
| 8,283,249 B2 | 10/2012 | Chan |
| 8,383,490 B2 | 2/2013 | Fan et al. |
| 2013/0193489 A1 | 8/2013 | Baars et al. |

\* cited by examiner

INTERCONNECT STRUCTURE INCLUDING MIDDLE OF LINE (MOL) METAL LAYER LOCAL INTERCONNECT ON ETCH STOP LAYER

BACKGROUND

The present invention relates to interconnect structures, and more specifically, to an interconnect structure including a middle of line (MOL) metal layer local interconnect.

Integrated circuits (ICs) are typically fabricated from one or more layers of different materials. Some layers, such as polysilicon layers, are used to form semiconductor devices, while other layers, such as patterned metal layers, provide electrical connections between semiconductor devices. Referring to FIG. 1, a conventional interconnect structure 100 including a plurality of stacked dielectric layers 102a-102b is illustrated. One dielectric layer 102b includes at least one initial first layer contact element metal layer (MO) structure 104 formed directly atop one or more electrically conductive embedded vias (CA/CB) 106/108. Thus, an entire layer (e.g., dielectric layer 102b) is dedicated to supporting only the first level (MO) metal layer structures 104, which makes it difficult to reduce the size (e.g., height) of the overall structure 100. In addition, since the metal layer structures 104 require a dedicated layer (e.g., dielectric layer 102b) for local isolation, a double patterning process including multiple masks is required to achieve the proper line-to-line spacing and tip-to-tip spacing.

SUMMARY

According to at least one non-limiting embodiment of the present invention, an interconnect structure includes an insulator stack on an upper surface of a semiconductor substrate. The insulator stack includes a first insulator layer having at least one semiconductor device embedded therein and an etch stop layer interposed between the first insulator layer and a second insulator layer. At least one electrically conductive local contact extends through each of the second insulator layer, etch stop layer and, first insulator layer to contact the at least one semiconductor device. The interconnect structure further includes at least one first layer contact element disposed on the etch stop layer and against the at least one conductive local contact.

According to another non-limiting embodiment, a method of forming an interconnect structure comprises forming an insulator stack on an upper surface of a semiconductor substrate. The insulator stack includes a first insulator layer having at least one semiconductor device embedded therein, an etch stop layer interposed between the first insulator layer and a second insulator layer, and at least one electrically conductive local contact extending through the insulator stack to contact the at least one semiconductor device. The method further includes selectively etching the second insulator layer to form at least one void that stops on an upper surface of the etch stop layer. The method further includes filling the at least one void with an electrically conductive material to form at least one first layer contact element against a sidewall of the at least one electrically conductive local contact.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings in which:

FIGS. 2-5 are a series of cross sectional views illustrating a process of fabricating an interconnected structure according to at least one non-limiting embodiment of the invention in which:

FIG. 2 illustrates an insulator stack covering a plurality of semiconductor devices formed on a semiconductor device, and a plurality of electrically conductive local contacts extending through the insulator stack to contact the semiconductor devices;

FIG. 3 illustrates the interconnect structure of FIG. 2 after performing a lithography patterning process to form voids extending through an upper insulator layer of the insulation stack and stopping on an etch stop layer;

FIG. 4 illustrates the interconnect structure of FIG. 3 after filling the voids with a metal material to form first level metal contacts in the upper insulator level and which abut the sidewalls of the conductive local contacts; and FIG. 5 illustrates the interconnect structure of FIG. 4 after forming an optional second metal layer including metal elements having electrically conductive vias that contact the conductive local contacts and/or the first level metal contacts.

DETAILED DESCRIPTION

Various non-limiting embodiments of the invention provide a fabrication process that performs a unique damascene-over-damascene process that selectively forms first metal trenches in an insulator layer supporting a portion of the local contacts. In this manner, first metal layer elements are formed against sidewalls of the first and/or second local contacts within a common insulator layer using only one litho-patterning process. Accordingly, the process requires less masks and less litho-patterning processes compared to conventional process used to form interconnect structures. Further, the resulting interconnect structure is capable of being fabricated with a reduced height compared to conventional interconnect structures. Therefore, at least one embodiment of the invention provides an interconnect structure having a lower parasitic capacitance when compared to conventional interconnect structures.

Figure 1:
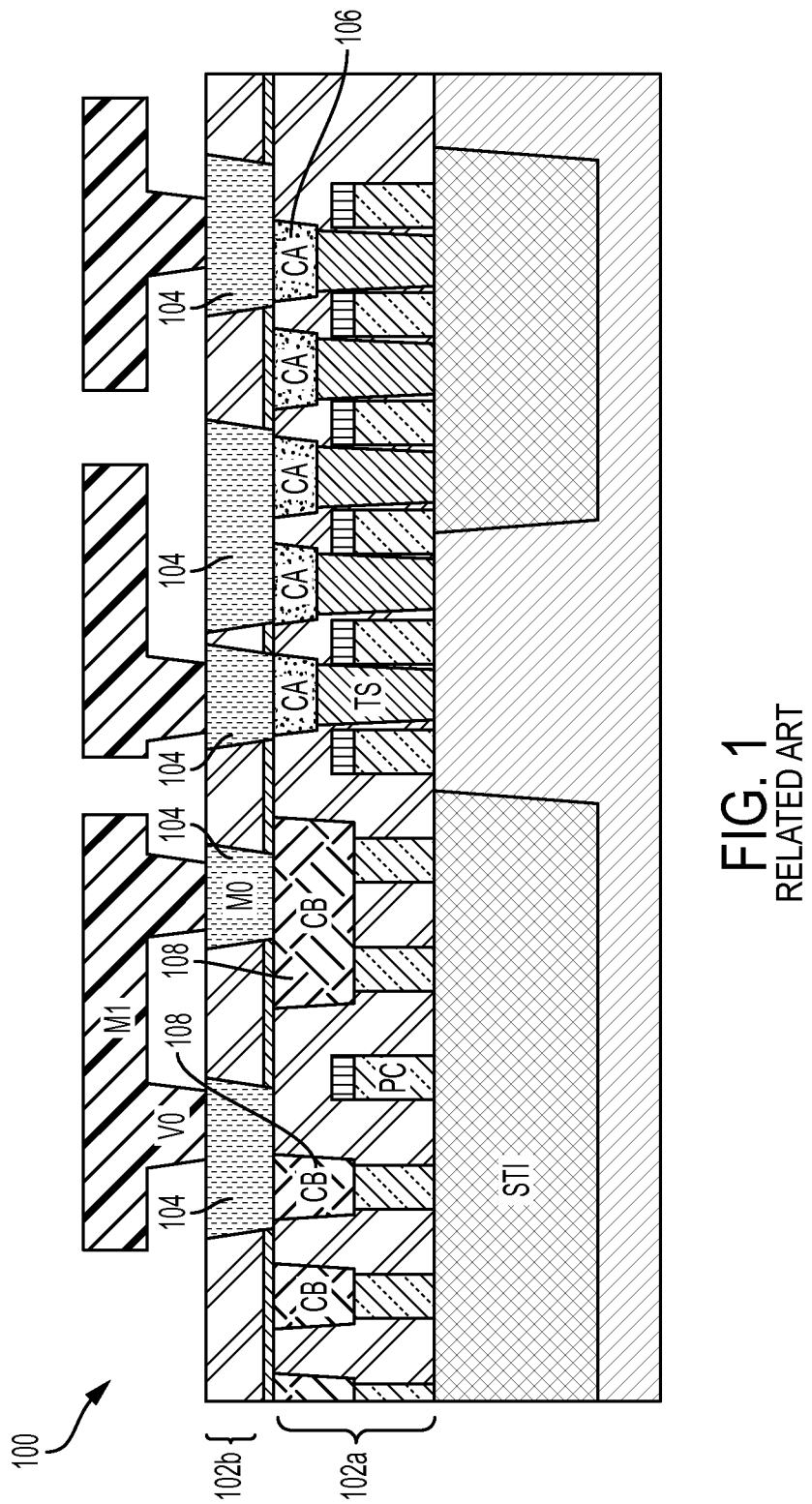
FIG. 1 illustrates a conventional interconnect structure having an insulator layer dedicated solely to supporting first layer metal contact elements.
Figure 2:
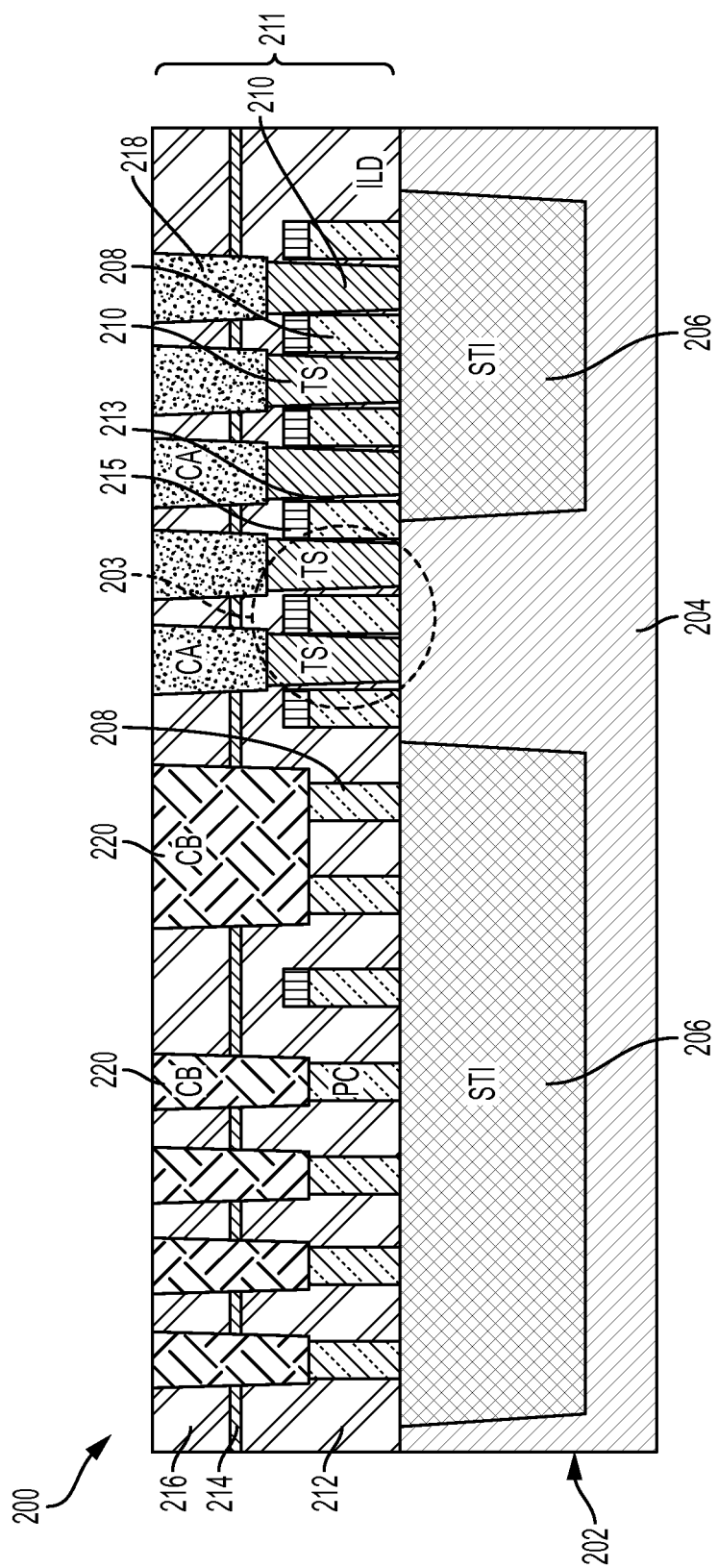

With reference now to FIG. 2, an intermediate interconnect device 200 is illustrated according to a non-limiting embodiment. In the present specification and "intermediate" semiconductor device is defined as a semiconductor device in a stage of fabrication prior to a final stage. The intermediate interconnect device 200 includes a layered integrated circuit (IC) structure formed on a substrate 202. The substrate 202 may include various types of semiconductor substrates including, but not limited to, a bulk semiconductor substrate, and a semiconductor-on-insulator (SOI) substrate. The bulk semiconductor substrate may be formed of, for example, single crystal silicon (Si), polycrystalline Si, silicon germanium (SiGe), and amorphous Si. The SOI substrate may include, for example, a buried insulator layer interposed between a bulk substrate layer and an active semiconductor layer. The buried insulator layer may be formed of, for example, silicon dioxide ($SiO_2$), and the active semiconductor layer may be formed of, for example, Si. According to a non-limiting embodiment illustrated in FIG. 2, the substrate 202 may include an active region 204 formed of Si, for example, which is interposed between opposing shallow trench isolation (STI) regions 206 formed of $SiO_2$, for example. The STI regions 206 serve to isolate the layered IC structure 200 from neighboring layered IC structures (not shown) formed on the same substrate 202.

The intermediate interconnect structure 200 further includes one or more gate elements 208 and one or more source/drain trench contacts 210 so as to form at least one semiconductor device 203 on an upper surface of the substrate 202. An insulator stack 211 is formed on an upper surface of the substrate so as to cover the gate elements 208 and the source/drain trench contacts 210. More specifically, the gate elements 208 and the source/drain trench contacts (TS) 210 are embedded in a first insulator layer 212 formed on an upper surface of the substrate 202. The gate elements 208 are formed of poly-silicon (PC), for example, and the source/drain trench contacts (TS) 210 are formed from various conducting metals including, but not limited to, tungsten (W), cobalt (Co), titanium (Ti), and copper (Cu). An etch stop layer 214 is formed on an upper surface of the first insulator layer 212, and a second insulator layer 216 is formed on an upper surface of the etch stop layer 214. In this manner, the etch stop layer 214 is interposed between the first insulator layer 212 and the second insulator layer 216 as further illustrated in FIG. 2. The etch stop layer 214 is formed from silicon nitride (SiN), for example, and has a thickness ranging from, for example, approximately 5 nanometers (nm) to approximately 50 nm. The first and second insulator layers 212/216 can be formed from the same dielectric material such as, for example $SiO_2$, or may be formed from different materials with respect to one another.

The source/drain trench contacts 210 are self-aligned with a respective gate element 208 following a gate-first formation process. For example, a selective RIE is performed to etch oxide material selective to nitride material. Accordingly, the oxide material between the adjacent gates 208 is removed without eroding the sidewall gate spacer 213 (e.g., nitride) and the gate cap layer 215 (e.g., nitride). The source/drain trench contacts 210 are then formed on the substrate 202 according to various well-known techniques so that trench contacts 210 are self-aligned with the remaining gate spacer 213 and the gate cap layer 215.

As further illustrated in FIG. 2, the intermediate interconnect device 200 includes one or more first local contacts (CA) 218 and one or more second local contacts (CB) 220. Each first local contact 218 is formed through the second insulator layer 216, the etch stop layer 214, and the first insulator layer 212 so as to contact an upper surface of a respective source/drain trench contact 210. In a similar manner, each second local contact 220 is formed through the second insulator layer 216, the etch stop layer 214, and the first insulator layer 212 so as to contact an upper surface of one or more gate elements 208.

A first etching process may be performed to form local contact trenches (not shown) that may be subsequently filled to form the first local contacts 218 and the second local contacts 220. For example, a lithographic masking layer (not shown) may be deposited on the upper surface of the second insulator layer 216, and subsequently patterned to designate the local contact trench regions. Thereafter, a first etching process such as, for example, a reactive ion etching (RIE) process, is performed to transfer the pattern into the second insulator layer 216. The RIE process is selective to the first insulator layer material, the etch stop layer material, and the first etch stop layer material so as to stop on an upper surface of the gate elements 208 and the source/drain trench contacts 210. It should be appreciated that the trenches related to the first and second local contacts 218/220 can be performed according to a two-step process. For instance, a first etching process forms first trenches related to the first local contacts 218, while a second etching process forms trenches related to the second local contacts 220.

According to a non-limiting embodiment, a first etching process, e.g., a first RIE process comprising $C_4F_6/O_2$, for example, is used to etch the first and second insulator layers 212/216, while a second etching process, e.g., a second RIE process comprising $CH_3F/O_2$, for example, is used to punch through the etch stop layer 214. According to an embodiment, the first etching process can be used to etch the second insulator layer 216 and expose the etch stop layer 214, while the second etching process can be used to both punch through the etch stop layer 214 and then continue etching the first insulator layer 212. Thereafter, a conductive material (e.g., copper or tungsten, cobalt or titanium) can be deposited in the trenches to form the first and second local contacts 218/220 as further illustrated in FIG. 2.

Figure 3:
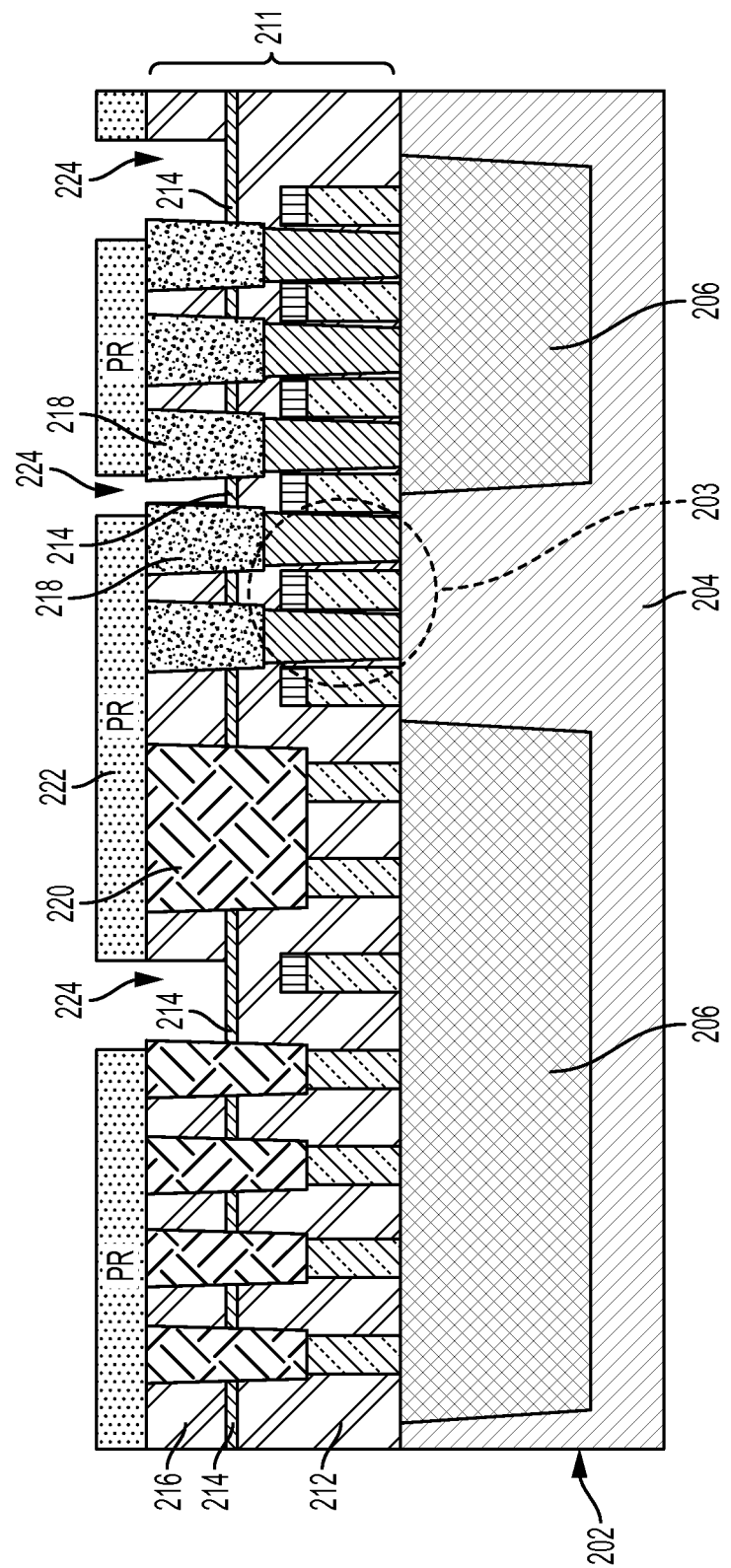

Turning now to FIG. 3, the interconnect device 200 is illustrated following patterning of a photoresist mask layer 222 deposited on upper surfaces of the second insulator layer 216, the first local contacts 218, and the second local contacts 220. Various etching chemistries selective to the photoresist mask layer 222 and the second insulator material 216 can be used including, but not limited to, a boron trichloride ($BCl_3$)-based etch, a sulfur hexafluoride ($SF_6$)-based etch, a benzalkonium chloride ($Cl_2$)-based etch, and a carbon fluorine ($CHF_3$)-based etch. In this manner, the photomask pattern stops on an upper surface of the etch stop layer 214 and forms one or more voids 224 in the second insulator layer 126, while the first local contacts 218 and the second local contacts 220 are preserved.

As further illustrated in FIG. 3, at least one embodiment includes a feature where one or more voids 214' are selectively formed in the second insulator layer 216, and between a pair of first local contacts 218. For example, the material of the second insulator layer 216 can be selectively etched with respect to the metal material of the first local contacts 218, for example. In this manner, the void 214' can be filled with an electrically conductive material (not shown in FIG. 3) to form a single first layer contact element (not shown in FIG. 3) that contacts both first local contacts 218 as discussed in greater detail below.

Figure 4:
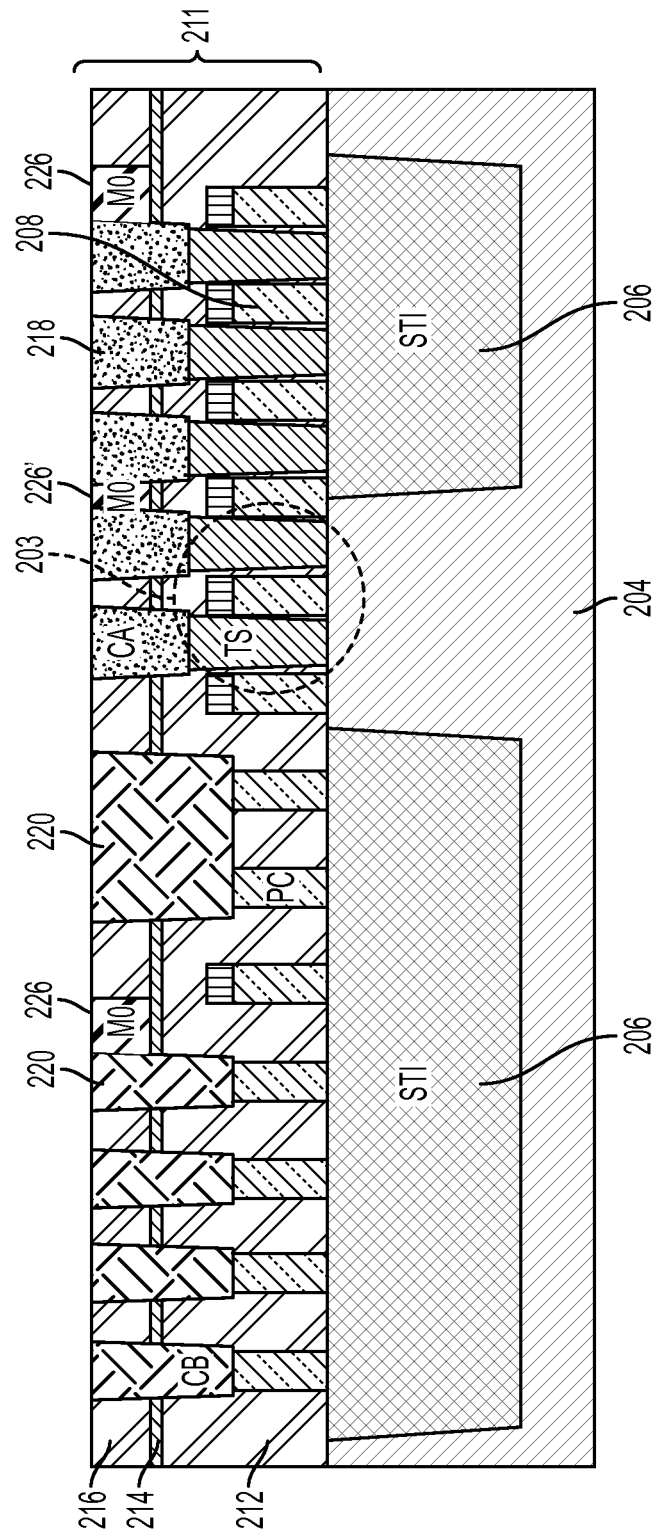

Turning to FIG. 4, the voids 224 are filled with an electrically conductive material 226, such as a metal material including, but not limited to, copper (Cu) and tungsten (W), for example. Thereafter, the remaining photoresist layer (previously indicated as element 222) is stripped away. The conductive material 226 can then subsequently be planarized using, for example, a chemical-mechanical polishing (CMP) process as further illustrated in FIG. 4. In this manner, the first layer contact elements 226, such as first metal layer (MO) elements 226 for example, are formed on an upper surface of the etch stop layer 214 and in the second insulator layer 216.

Since the etch stop layer 214 and the first/second local contacts 218/220 are selectively protected when forming the voids 224, the first metal layer elements 226 can be formed directly against sidewalls of one or more of the first and/or second local contacts 218/220 embedded in the same second insulator layer 216 to form a conductive path therebetween. That is, unlike conventional interconnect structures that include an entire insulator layer containing only the metal layer elements (i.e., excluding all other elements but the metal layer elements), at least one embodiment of the present invention provides a feature where the first metal layer elements 226 and at least a portion of the local contacts 218/220 are embedded in a single common insulator layer 216. Furthermore, the upper surface of the first metal layer elements 226 are formed flush with the first and second local contacts 218/220 formed in a common insulator layer 216. Accordingly, the size (e.g., the height) of the interconnect structure 200 is reduced compared to conventional interconnect structures that require an entire insulator layer dedicated to supporting only metal layer elements. In this manner, the interconnect structure 200 has a lower parasitic capacitance when compared to conventional interconnect structures.

As mentioned above, at least one embodiment includes a feature where void 214' is formed in the second insulator layer 216 and between a pair of first local contacts 218. As further illustrated in FIG. 4, the void 214' is filled with an electrically conductive material such as metal, for example, to form a shared first metal layer element 226' having a first side that abuts a first sidewall the first conductive 218 (e.g., the left local contact 218) and a second side that abuts a second sidewall of the second conductive local contact 218 (e.g., the right local contact 218). In this manner, a single first metal layer element 226' can form a conductive connection between two local contacts embedded in an insulator layer that is shared with the first metal layer element 226'.

Figure 5:
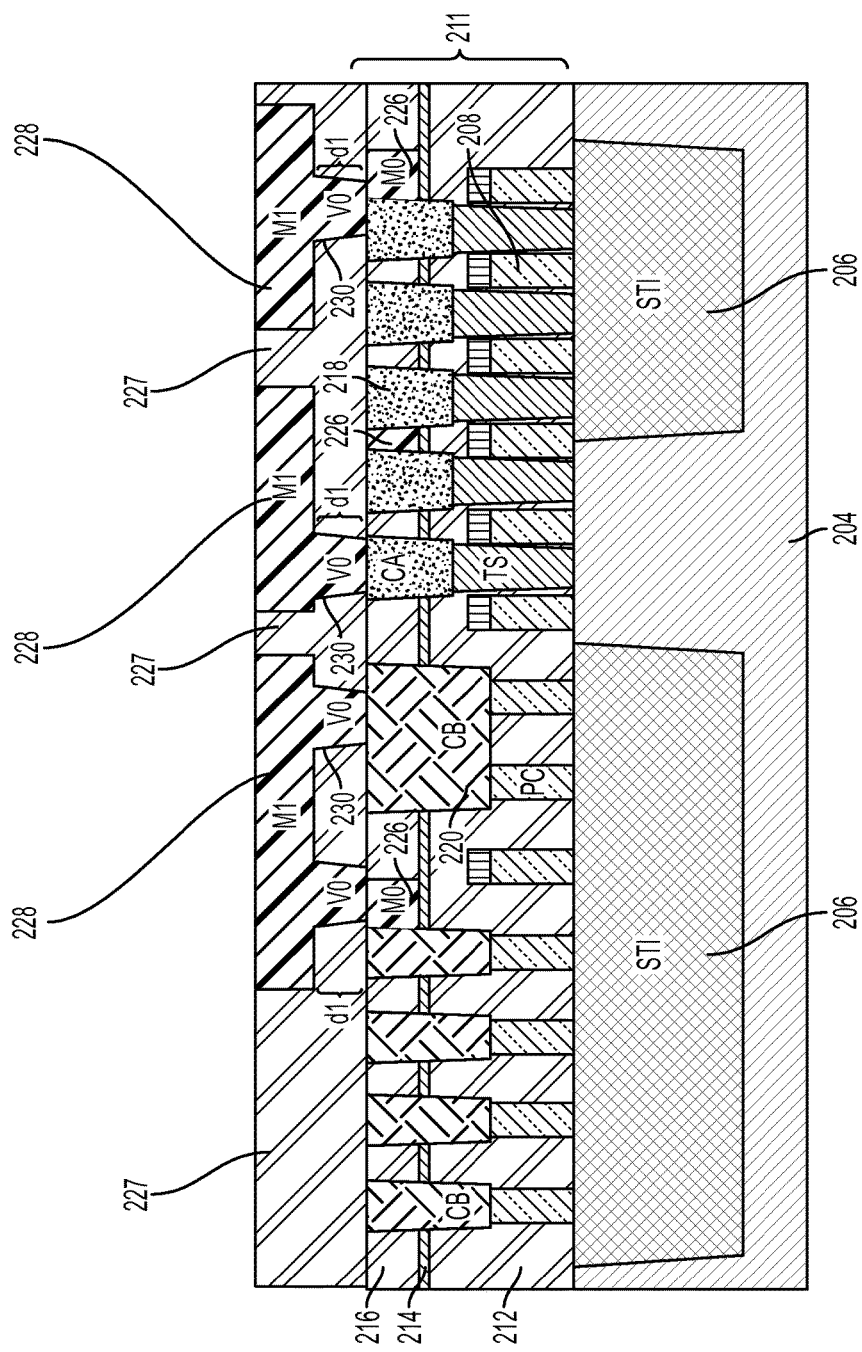

Referring now to FIG. 5, the interconnect device 200 is illustrated after forming a third insulator layer 227 atop the second insulator layer 216, and forming one or more second metal layer (M1) elements 228 in the third insulator layer 227. The second metal layer elements 228 includes one or more electrically conductive vias 230 that connect one or more portions of the second metal layer elements 228 to a first metal layer element 226 and/or a local contact 218/220. The third insulator layer 227 surrounds the metal layer elements 228 and the vias 227 to create an electrical isolation with respect to one another. The second metal layer elements 228 and vias 230 are processed in accordance with existing techniques such, for example, well-known dual damascene techniques. In this manner, vias 230 connecting the second metal layer elements 228 to first metal layer elements 226 and local contacts 218/220 have a common length (i.e., d1).

As described in detail above, various embodiments provide an interconnect structure including one or more first metal layer elements formed directly against sidewalls of one or more of the first and/or second local contacts embedded in the same second insulator layer. Accordingly, the size (e.g., the height) of the interconnect structure is reduced compared to conventional interconnect structures that require an entire insulator layer dedicated to supporting only metal layer elements. In this manner, the interconnect structure has a lower parasitic capacitance when compared to conventional interconnect structures. In addition, at least one embodiment provides a fabrication process that performs a unique damascene-over-damascene process that selectively forms first metal trenches in an insulator layer supporting a portion of the local contacts. In this manner, first metal layer elements are formed against sidewalls of the first and/or second local contacts within a common insulator layer using only one litho-patterning process. Accordingly, the process requires less masks and less litho-patterning processes compared to conventional process used to form interconnect structures.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A method of forming an interconnect structure, comprising:
    forming an insulator stack on an upper surface of a semiconductor substrate, the insulator stack comprising a first insulator layer having at least one semiconductor device embedded therein, an etch stop layer interposed between the first insulator layer and a second insulator layer, and at least one electrically conductive local contact extending through the insulator stack to contact the at least one semiconductor device;

selectively etching the second insulator layer to form at least one void that stops on an upper surface of the etch stop layer; and filling the at least one void with an electrically conductive material to form at least one first layer contact element against a sidewall of the at least one electrically conductive local contact.

2. The method of claim 1, wherein the selectively etching the second insulator layer includes etching the second insulator layer while preserving the etch stop layer and the at least one conductive local contact.

3. The method of claim 2, further comprising performing a planarization process such that an upper surface of the at least one first layer contact element is flush with an upper surface of the at least one conductive local contact.

4. The method of claim 3, wherein second insulator layer contains embedded therein the upper portion of the at least one conductive local contact and a full portion of the at least one first layer contact element.

5. The method of claim 4, wherein the upper portion of the at least one conductive local contact is flush with an upper surface of the second insulator layer and a lower portion of the at least one conductive local contact extends into the first insulator layer and contacts the at least one semiconductor device.

6. The method of claim 5, wherein the upper surface of the at least one first layer contact element is flush with the upper surface of the second insulator layer and a lower surface of the at least one first layer contact element is disposed directly against an upper surface of the etch stop layer.

7. The method of claim 2, wherein the at least one conductive local contact and the at least one first layer contact element comprise a metal material.

8. The method of claim 3, wherein the at least one conductive local contact comprises copper (Cu) and the at least one first layer contact element comprises tungsten (W).

9. The method of claim 2, wherein the second insulator layer comprises silicon dioxide ($SiO_2$), and the etch stop layer comprises silicon nitride (SiN).

10. The method of claim 2, further comprising selectively etching the second insulator layer to form a second void in the second insulator layer between a pair of first and second conductive local contacts, and filling the void with an electrically conductive material to form at least one shared first layer contact element having a first side that abuts a first sidewall of the first conductive local contact and a second side that abuts a second sidewall of the second conductive local contact.

* * * * *